(12) United States Patent
Smith

(10) Patent No.: US 6,934,010 B2
(45) Date of Patent: Aug. 23, 2005

(54) OPTICAL PROXIMITY CORRECTION METHOD UTILIZING GRAY BARS AS SUB-RESOLUTION ASSIST FEATURES

(75) Inventor: Bruce W. Smith, Penfield, NY (US)

(73) Assignee: ASML Masktools B.V., Veldhoven (NL)

( * ) Notice: Subject to any disclaimer, the term of this patent is extended or adjusted under 35 U.S.C. 154(b) by 0 days.

(21) Appl. No.: 10/083,694

(22) Filed: Feb. 27, 2002

(65) Prior Publication Data

US 2002/0186356 A1 Dec. 12, 2002

Related U.S. Application Data

(60) Provisional application No. 60/271,880, filed on Feb. 27, 2001.

(51) Int. Cl.⁷ .................. G03B 27/72; G03B 27/42; G03B 27/52; G03F 9/00
(52) U.S. Cl. .................. 355/69; 355/53; 355/30; 430/5
(58) Field of Search .................. 355/30, 53, 77, 355/69; 430/5, 323, 324, 30, 22, 322

(56) References Cited

U.S. PATENT DOCUMENTS

| | | | |
|---|---|---|---|
| 5,229,230 A | 7/1993 | Kamon | |
| 5,229,255 A | 7/1993 | White | 430/311 |
| 5,242,770 A | 9/1993 | Chen et al. | 430/5 |
| 5,256,505 A | 10/1993 | Chen et al. | 430/5 |
| 5,288,569 A | 2/1994 | Lin | 430/5 |
| 5,324,600 A | 6/1994 | Jinbo et al. | 430/5 |
| 5,362,584 A | 11/1994 | Brock et al. | 430/5 |
| 5,424,154 A | 6/1995 | Borodovsky | 430/5 |
| 5,436,095 A | 7/1995 | Mizuno et al. | 430/5 |
| 5,447,810 A | 9/1995 | Chen et al. | 430/5 |
| 5,538,815 A | 7/1996 | Oi et al. | 430/5 |
| 5,663,893 A | 9/1997 | Wampler et al. | 364/491 |
| 5,707,765 A | 1/1998 | Chen | 430/5 |
| 5,723,233 A | 3/1998 | Garza et al. | 430/5 |
| 5,807,649 A * | 9/1998 | Liebmann et al. | 430/5 |
| 5,821,014 A | 10/1998 | Chen et al. | 430/5 |
| 5,827,623 A | 10/1998 | Ishida et al. | 430/5 |
| 8,048,647 | 4/2000 | Miyazaki et al. | |
| 6,114,071 A * | 9/2000 | Chen et al. | 430/5 |
| 6,458,493 B2 * | 10/2002 | Bula et al. | 430/5 |
| 2003/0064298 A1 * | 4/2003 | Broeke et al. | 430/5 |

FOREIGN PATENT DOCUMENTS

| | | |
|---|---|---|
| EP | 1 152 288 | 11/2001 |
| EP | 1 174 784 | 1/2002 |
| JP | 07064274 | 3/1995 |
| JP | 08188073 | 7/1996 |
| JP | 09-073166 | 3/1997 |
| JP | 10-326009 | 12/1998 |
| JP | 11-084625 | 3/1999 |
| JP | 11143047 | 5/1999 |

OTHER PUBLICATIONS

"Nakaos et al.", "A Novel RET for Random Pattern Formation Utilizing Attenuating Non–Phase–Shift Assist Pattern", pp. 44, 45, 2000, Tokyo, Japan XP010513500.

* cited by examiner

*Primary Examiner*—Peter B. Kim
(74) *Attorney, Agent, or Firm*—McDermott Will & Emery LLP

(57) ABSTRACT

A photolithography mask for optically transferring a pattern formed in the mask onto a substrate and for negating optical proximity effects. The mask includes a plurality of resolvable features to be printed on the substrate, and at least one non-resolvable optical proximity correction feature disposed between two of the resolvable features to be printed, where the non-resolvable optical proximity correction feature has a transmission coefficient in the range of greater than 0% to less than 100%.

18 Claims, 18 Drawing Sheets

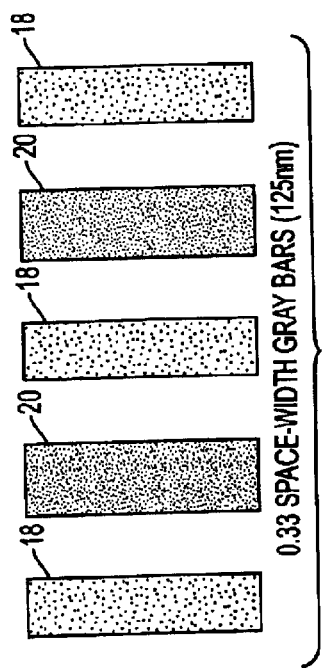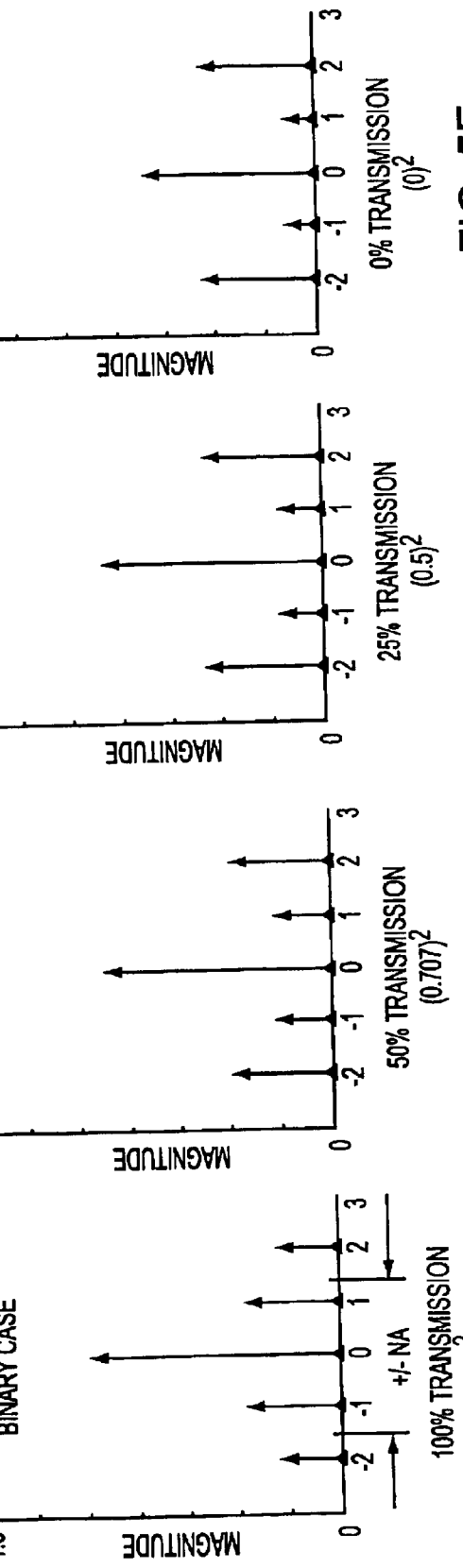

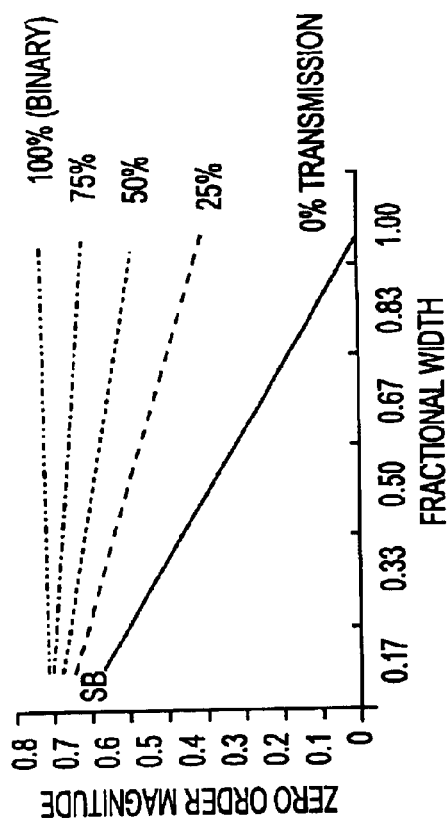
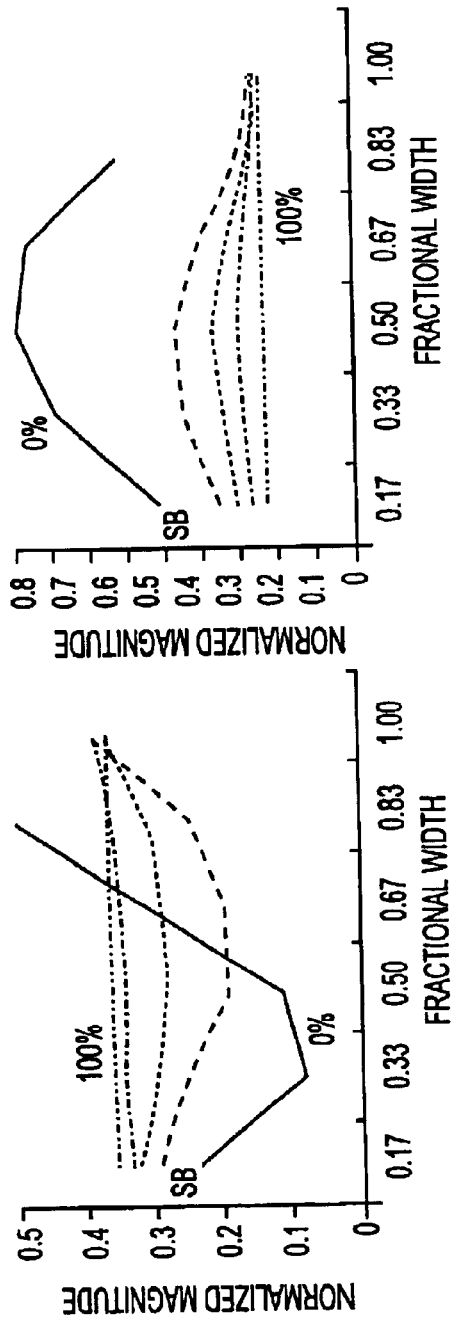
FIG. 6A
FIG. 6B
FIG. 6C

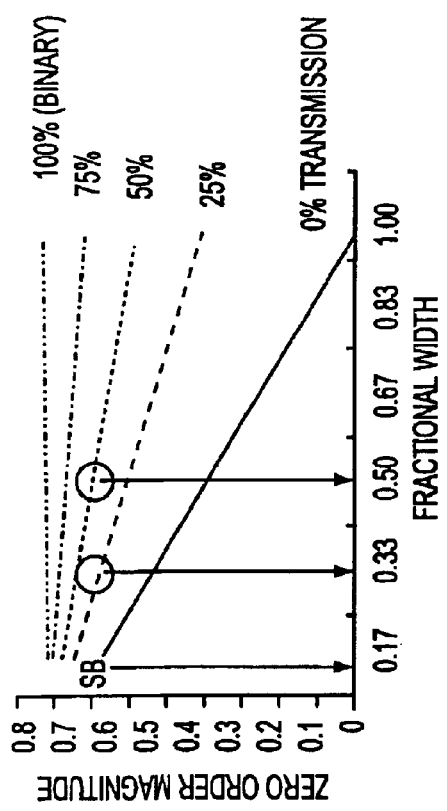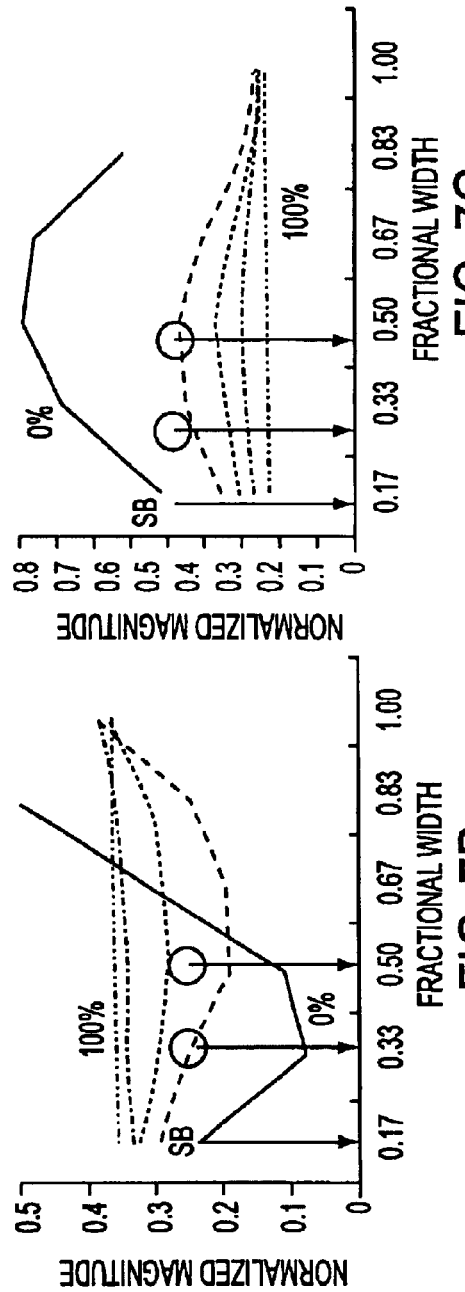

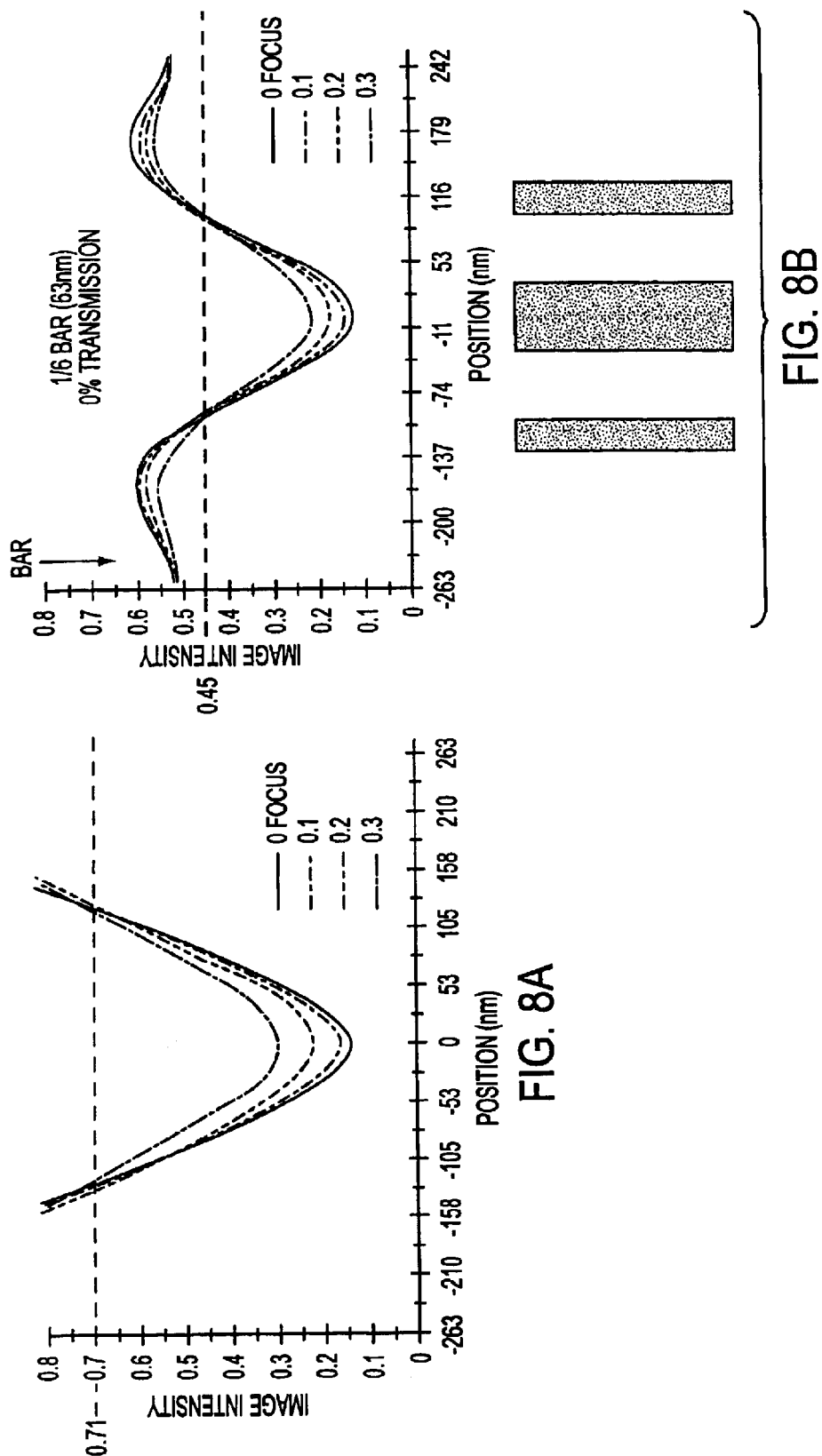

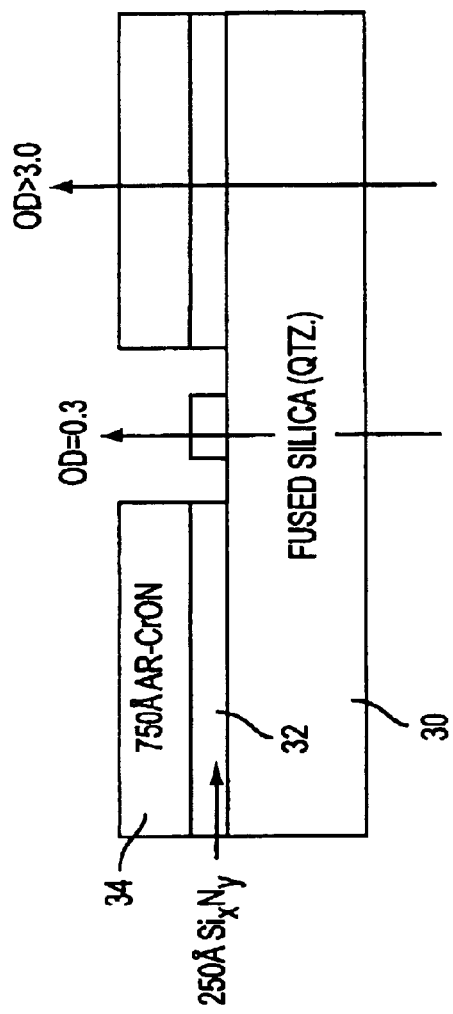

OPTICAL PROXIMITY CORRECTION METHOD UTILIZING GRAY BARS AS SUB-RESOLUTION ASSIST FEATURES

RELATED APPLICATION

This application claims priority from U.S. Provisional Patent Application No. 60/271,880, filed on Feb. 27, 2001, the entire disclosure of which is hereby incorporated by reference herein.

FIELD OF THE INVENTION

The present invention relates to photolithography, and in particular to the design and generation of a photomask ("mask") having sub-resolution optical proximity correction ("OPC") features, which function to correct for optical proximity effects and increase the overall processing performance. The present invention also relates to the use of such a mask in a lithographic projection apparatus, which generally comprises:

a radiation system for supplying a projection beam of radiation;

a support structure for supporting patterning means (e.g., mask), the patterning means serving to pattern the projection beam according to a desired pattern;

a substrate table for holding a substrate; and a projection system for projecting the patterned beam onto a target portion of the substrate.

BACKGROUND OF THE INVENTION

Lithographic apparatus can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or the smallest space between two lines. Thus, the CD determines the overall size and density of the designed circuit.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

As the critical dimensions of the circuit layout become smaller and approach the resolution value of the exposure tool, the correspondence between the mask pattern and the actual circuit pattern developed on the photoresist layer can be significantly reduced. The degree and amount of differences in the mask and actual circuit patterns depends on the proximity of the circuit features to one another. Accordingly, pattern transference problems are referred to as "proximity effects."

To help overcome the significant problem of proximity effects, a number of techniques are used to add sub-lithographic features to mask patterns. Sub-lithographic features have dimensions less than the resolution of the exposure tool, and therefore do not transfer to the photoresist layer. Instead, sublithographic features interact with the original mask pattern and compensate for proximity effects, thereby improving the final transferred circuit pattern.

Examples of such sub-lithographic features are scattering bars and anti-scattering bars, such as disclosed in U.S. Pat. No. 5,821,014 (incorporated herein by reference), which are added to mask patterns to reduce differences between features within a mask pattern caused by proximity effects. More specifically, sub-resolution assist features, or scattering bars, have been used as a means to correct for optical proximity effects and have been shown to be effective for increasing the overall process window (i.e., the ability to consistently print features having a specified CD regardless of whether or not the features are isolated or densely packed relative to adjacent features). As set forth in the '014 patent, generally speaking, the optical proximity correction occurs by improving the depth of focus for the less dense to isolated features by placing scattering bars near these features. The scattering bars function to change the effective pattern density (of the isolated or less dense features) to be more dense, thereby negating the undesirable proximity effects associated with printing of isolated or less dense features. It is important, however, that the scattering bars themselves do not print on the wafer. Thus, this requires that the size of the scattering bars must be maintained below the resolution capability of the imaging system.

Accordingly, as the limits of optical lithography are being enhanced far into the sub-wavelength capability, assist features, such as scattering bars, must be made smaller and smaller so that the assist features remain below the resolution capability of the imaging system. However, as imaging systems move to smaller wavelengths and higher numerical apertures, the ability to manufacture the photomasks with sub-resolution scattering bars sufficiently small becomes a critical issue and a serious problem. In addition, there are also problems associated with the utilization of assist features, such as scattering bars, due to the fact that the overall effect of the assist feature can vary in accordance with variations in the pitch of the features to be printed (i.e., ranging from dense features to isolated features), thereby undesirable preventing an increase in the process window.

Another known optical proximity correction (OPC) technique is disclosed by Lin in U.S. Pat. No. 4,902,899, in which halftoned elements are utilized to fill space openings or dark regions of a photomask. However, the technique disclosed by Lin is limited in its image enhancement capabilities and does not provide for an increase in the overall process window.

Thus, there exists a need for a method of providing assist features in a photomask which eliminates the foregoing problems associated with known assist features.

SUMMARY OF THE INVENTION

Accordingly, it is an object of the present invention to provide a method of forming a photolithography mask having OPC assist features which improve imaging fidelity, while at the same time increase the performance overlap for features having various spacing therebetween (i.e., dense to isolated).

More specifically, the present invention relates to a photolithography mask (and a method for forming the mask) comprising gray bars as OPC assist features. The gray bars, which have a transmission value variable between 0–100%, are positioned between the features on the mask so as to control the magnitude of diffraction orders received by a collection lens, thereby allowing for the control of imaging characteristics of individual features on the mask. Further, by controlling the width, placement and transmission values of the gray bar assist features, the present invention allows for features having various line:space duty ratios to be printed utilizing the same process window.

In operation, the gray bars, which are placed in space regions of the mask (i.e., between features), consume some fraction of the space region, thereby decreasing the light intensity within the space region (and the average amplitude of the electric field in the space region) and correspondingly, the magnitude of the background (zero or DC) diffraction order in the collection lens. By sizing the gray bar assist features to be a fraction of the space region less than the total space region between features, additional high order frequency terms for a given feature spacing are increased. In addition, by placing these gray bar assist features midway between the features that define a space region, the higher order frequency terms correspond to harmonics of the fundamental frequency of the local mask geometry. As explained in more detail below, this allows for a decrease in the background intensity while at the same time limiting the decrease in the image fidelity or image contrast. Gray bar assist features can also be placed within the darks regions between clear space features.

The present invention provides significant improvements and advantages over prior art OPC techniques. For example, by utilizing gray bar assist features having a width smaller than the width of the space between the features, and by controlling the size, transmission, location and spatial frequency of the gray bar assist features, the diffraction energy in the collection lens can be modified to allow for image enhancement which improves upon the image enhancement obtainable utilizing prior art OPC techniques. More specifically, by manipulating the dimensions and transmission coefficient of the gray bar assist features, the present invention allows for features having various line:space duty ratios to be printed utilizing the same process window, while simultaneously minimizing the likelihood that the assist feature will print.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phaseshifting, hybrid, etc.), examples of other such patterning means include:

a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference.

a programmable LCD array. An example of such a construction is given in U.S. Pat. No. 5,229,872, which is incorporated herein by reference.

The invention itself, together with further objects and advantages, can be better understood by reference to the following detailed description and the accompanying schematic drawings.

BRIEF DESCRIPTION OF THE DRAWINGS

FIGS. 5(a)–5(e) illustrate an exemplary mask comprising the gray bar assist features of the present invention, and the corresponding diffraction patterns resulting from varying the transmission coefficients of the gray bar assist features.

FIGS. 6(a)–6(c) illustrate how the primary diffraction orders (i.e., 0, 1st and 2nd) are influenced by the gray bar assist features of the present invention.

FIGS. 7(a)–7(c) illustrate "equivalent solutions" for known scatter bars and gray bar assist features of the present invention.

FIGS. 8(a)–8(d) illustrate simulated aerial images for a 150 nm wide feature having a line:space duty ratio of 1:2.5, which are imaged with a 248 nm wavelength, a 0.70 lens pupil NA, and a partial coherence value (sigma) of 0.85.

FIG. 13 illustrates a first exemplary method for forming the gray bar assist features of the present invention.

FIGS. 15(a)–(c) are of the zero, normalized first and normalized second diffraction order values, respectively, for a feature having a 1:2.5 line:space duty ratio and 6% APSM with various gray bar widths and gray bar transmissions. FIGS. 15(d)–(f) illustrate the same, with the exception being the use of 18% APSM.

FIG. 16 is a summary of exemplary gray bar assist feature dimensions utilized to accommodate for various line:space duty ratios for a given feature size.

DETAILED DESCRIPTION OF THE INVENTION

In accordance with the optical proximity correction technique of the present invention, non-resolvable gray bar assist features having a transmission which can vary from 0–100% are utilized as sub-resolution assist features. As explained in detail below, the use of the gray bar assist features of the present invention, among other things, allows for an improvement in the process overlap (i.e., the ability to print dense and semi-isolated features utilizing the same process).

Figure 1:
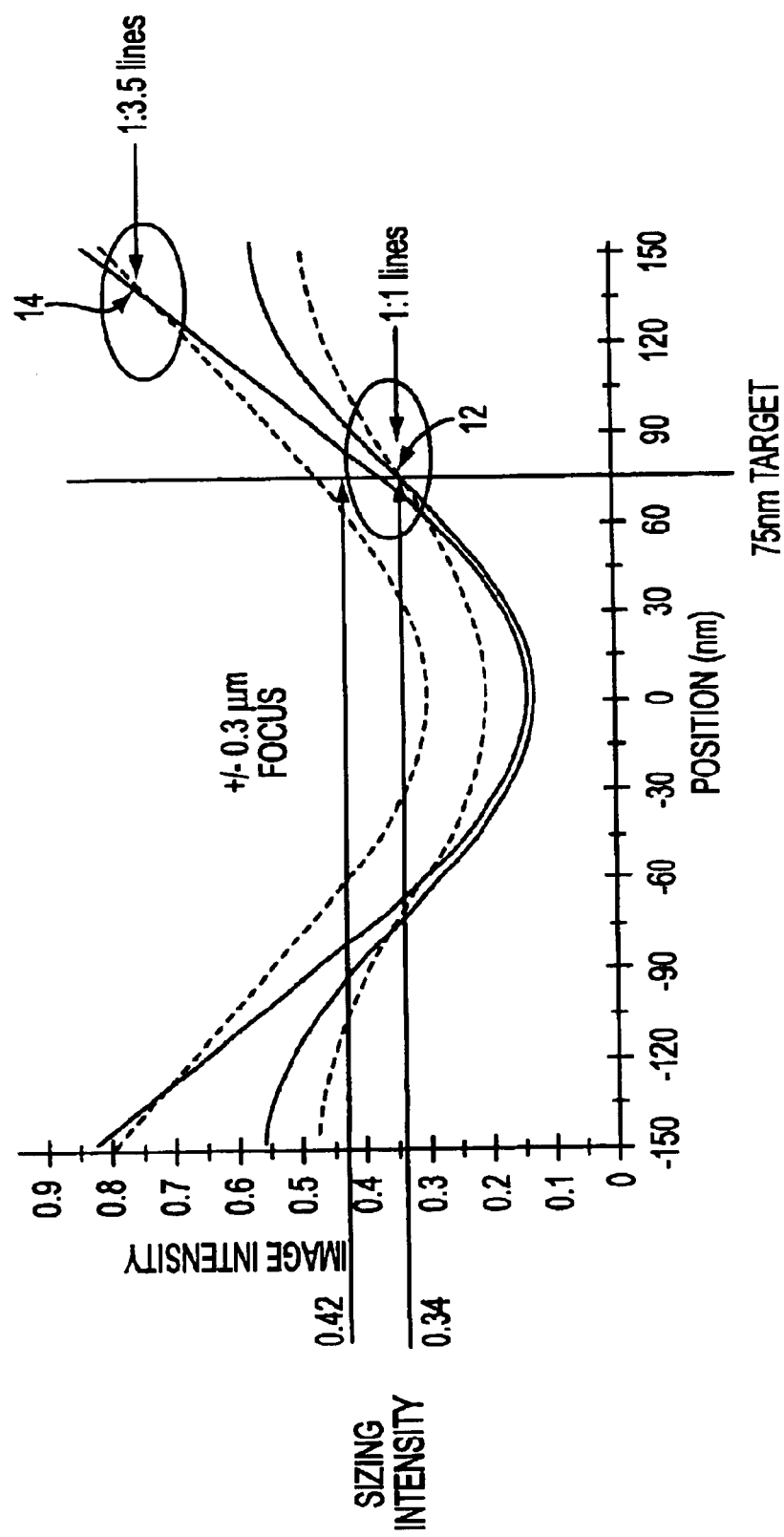
FIG. 1 illustrates a comparison of aerial images of mask features having the same size and different duty ratios (i.e., pitch between features).

FIG. 1 is helpful in understanding one of the problems solved by the present invention, which relates to imaging small features across a range of line:space duty ratios. Referring to FIG. 1, the figure illustrates simulated aerial images for two imaging scenarios. In the first scenario, 150 nm lines having a 1:1 line:space duty ratio (i.e., dense features) are imaged utilizing a 248 nm wavelength, a 0.70 lens pupil NA, and a partial coherence value (sigma) of 0.85. In the second scenario, everything remains the same, with the exception that the line:space duty ratio is changed to 1:3.5 (i.e., semi-isolated images). Both the 1:1 dense features and the 1:3.5 semi-isolated features are shown at best focus and with 300 nm of defocus. The simulated aerial images of FIG. 1 illustrate problems associated with imaging geometries of varying line:space duty ratio.

More specifically, referring to FIG. 1, it is shown that the dense features generally suffer from poor contrast, and yet are less affected by variations in defocus because of the location of the image's isofocal inflection point. In the given example, it is noted that the isofocal inflection point corresponds to the location at which the image prints with minimal losses regardless of whether the image is printed with substantially no defocus (i.e., best focus) or with 300 nm of defocus. For the 1:1 dense features, the isofocal inflection point 12 falls dimensionally close to the position of the mask edge. In comparison, the 1:3.5 semi-isolated features exhibit higher contrast, but suffer from defocus and aberration effects. This results from large positional differences between the location of the isofocal inflection point 14 and the mask edge, which is a consequence of an increase in the zero diffraction order. As a result of the variation of the location of the isofocal inflection points associated with the dense and semi-isolated features, it is difficult to print these features with a common process window.

Figure 2:
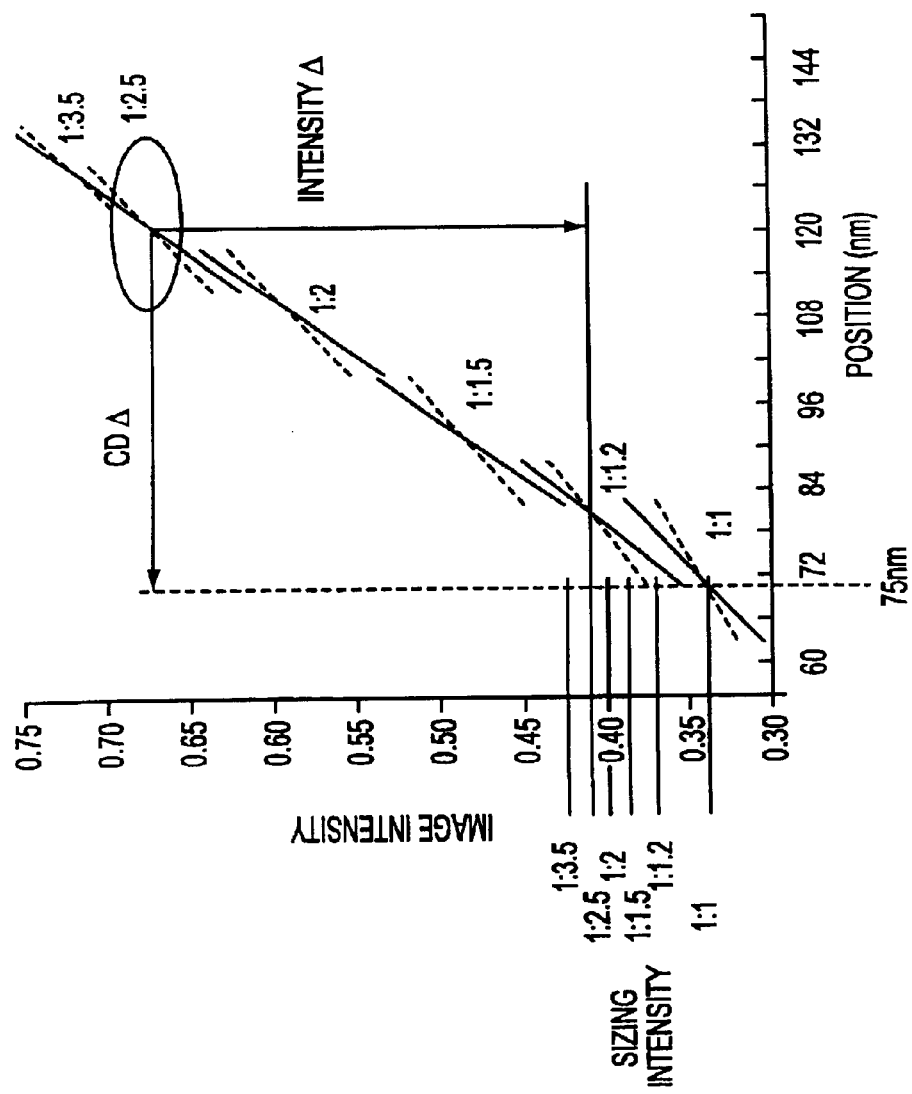
FIG. 2 illustrates portions of simulated aerial images for 150 nm features having various line:space duty ratios.

FIG. 2 illustrates portions of simulated aerial images for 150 nm features having various line:space duty ratios (ranging from 1:1 to 1:3.5), which were all printed utilizing the same imaging conditions. As shown in FIG. 2, as the distance between the features becomes greater (i.e., increasing line:space ratio), the corresponding isofocal inflection points move progressively farther away from the mask edge and farther from the resist intensity thresholding position. In other words, as the line:space ratio increases, the resulting isofocal inflection point is distributed increasingly farther away from the value associated with the 1:1 line:space ratio in terms of both intensity value and the position (i.e., critical dimension (CD)). This movement of the isofocal inflection points of non-dense features away from that of the 1:1 dense feature limits/negates the ability to print dense and non-dense features utilizing the same process window (i.e., the same printing conditions).

Accordingly, in order to improve the imaging results and allow for dense and non-dense features to be printed utilizing the same process window, it is desirable to drive the image intensity and the position of the isofocal inflection point of the non-dense features as close as possible to the image intensity and the isofocal inflection point of the dense feature. As explained in detail below, the present invention provides a method for achieving the foregoing objective so as to allow dense and non-dense features to be printed utilizing the same process window, while simultaneously minimizing the likelihood that the assist features will print.

Figure 3B:
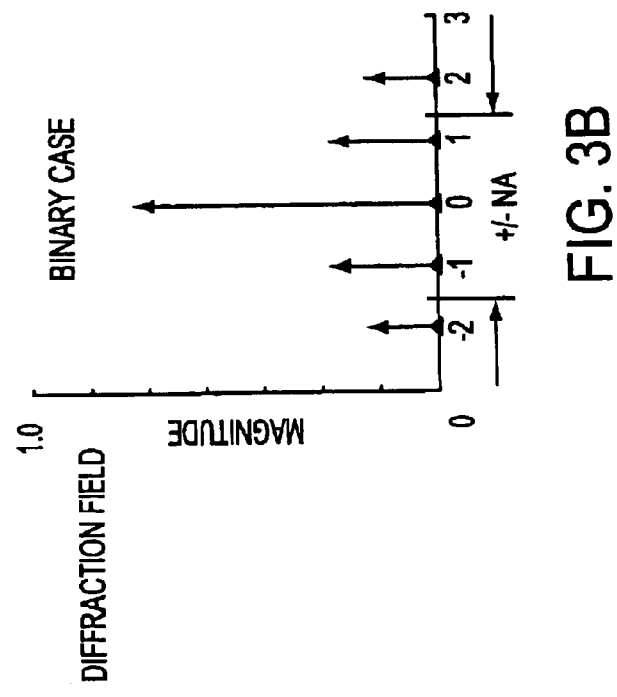
FIGS. 3(a) and (b) illustrate an exemplary binary mask and the corresponding zero, first and second diffraction orders for the binary mask.
Figure 3A:
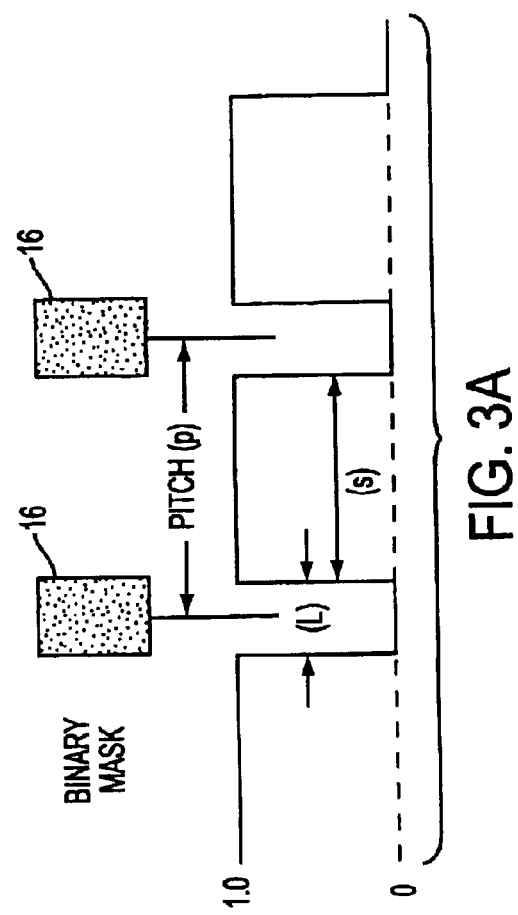

It is known that the primary diffraction orders influence and/or determine the aerial image, and in particular, the isofocal inflection point and the image intensity, of a given image. The magnitude of the zero, first and second diffraction orders for a real/even binary mask, such as illustrated in FIG. 3a, can be defined as:

Mag. zero order=$(s/p)$

Mag. first order=$|(s/p)\mathrm{sinc}(s/p)|$

Mag. second order=$|(s/p)\mathrm{sinc}(2s/p)|$ where s is the space (i.e., width) between features 16, and p is the pitch between features. Exemplary magnitudes of the zero, first and second diffraction orders for the binary mask of FIG. 3(a) are illustrated in FIG. 3b.

As evident from the foregoing equations, as the feature line:space duty ratio increases (where space size is increased), the magnitude of the zero diffraction order increases proportionally, which leads to the larger isofocal intensity of the aerial image. As a result, the location of the isofocal point is driven away from the mask edge as fewer diffraction orders are collected. The present invention utilizes the gray bar assist features to modify/manipulate the values of these diffraction orders so as to drive the isofocal inflection point and the image intensity of the less dense features toward that of the dense features, thereby providing for an improvement in the process overlap.

Figure 4:
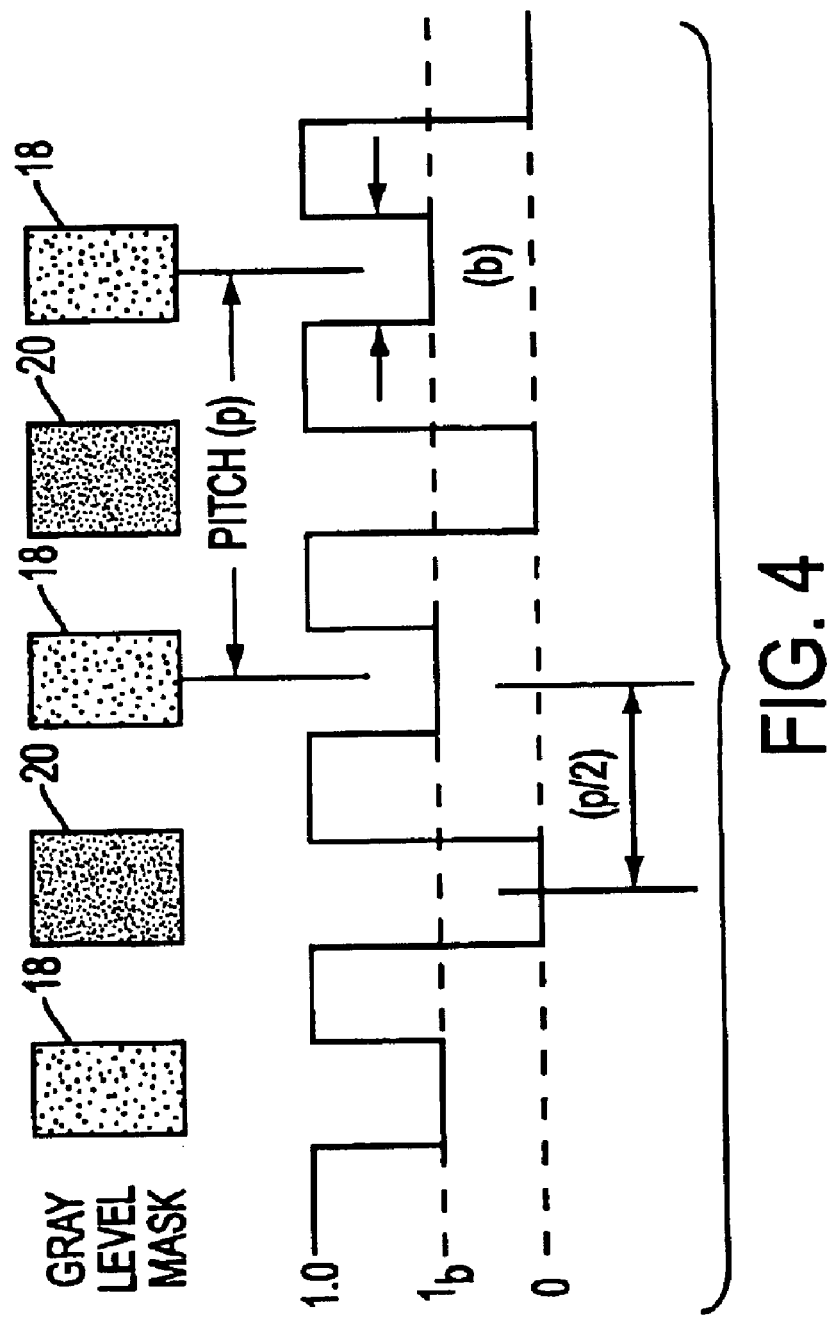
FIG. 4 illustrates an exemplary mask comprising the gray bar assist features of the present invention.

FIG. 4 illustrates one example of how the gray bar assist features can be utilized to vary the isofocal inflection point and the image intensity of the less dense features toward that of the dense features. As shown in FIG. 4, a gray bar assist feature 18 is positioned between each feature 20 to be printed. Of course, it is noted that the gray bar assist features 18 need not be placed between every feature contained on a given mask, but only those for which it is desirable to provide OPC (e.g., the non-dense features). The effect that the gray bar assist features 18 have on the magnitude of the zero, first and second diffraction orders can be calculated for the mask such as that shown in FIG. 4. More specifically, for opaque main features 20 and non-attenuating clear openings, the magnitude of the orders become:

Mag. zero order=$[1-(b/s)(1-\sqrt{I_b})](s/p)$

Mag. first order=$|(s/p)\mathrm{sinc}(s/p)-(1-\sqrt{I_b})(b/p)\mathrm{sinc}(b/p)|$ Mag. second order=$|(s/p)\mathrm{sinc}(2s/p)-(1-\sqrt{I_b})(b/p)\mathrm{sinc}(2b/p)|$ where s is the space (i.e., width) between features 20, p is the pitch between feature, b is the width of the gray bar assist feature 18, and $I_b$ is the transmission intensity of the gray bar assist feature. As is clear from the foregoing equations, the zero, first and second diffraction orders can be manipulated/adjusted by controlling the width and/or the intensity of the gray bar assist feature 18. As mentioned above and explained in more detail below, the manipulation of these diffraction orders allows the isofocal inflection point and the image intensity of the less dense features to be driven toward that of the dense features.

FIGS. 5(b)–5(e) illustrate resulting diffraction patterns for gray bar assist features 18 utilized in the mask illustrated in FIG. 5(a), which contains 150 nm features having a space of 375 nm between features 20. The gray bar assist features 18 have a width ⅓ of the space dimension. Four variations of the gray bar assist features 18 are illustrated in FIGS. 5(b)–5(e), 100% transmission (FIG. 5(b)), 50% transmission (FIG. 5(c)), 25% transmission (FIG. 5(d)) and 0% transmission (FIG. 5(e)). As shown, by adjusting the transmission % of the gray bars, it is possible to control/manipulate the values of the diffraction orders. In particular, it is noted that both the 50% and 25% transmission gray bars result in a second diffraction order (see, FIGS. 5(c) and 5(d)) that is lower than the second diffraction order of the corresponding scatter bar case (see, FIG. 5(e)). This reduction of the second diffraction order is important as it is necessary to prevent the gray bar assist feature from printing.

It is noted that the 0% transmission case corresponds to the scatter bar assist feature, as disclosed in U.S. Pat. No. 5,821,014, when the scatter bar dimension is small enough such that it does not print. As scatter bars must remain sub-resolution, the maximum width of scatter bars is approximately ⅓ the value of the exposure wavelength. Accordingly, as the wavelength of the exposing source continues to decrease, it becomes exceedingly difficult to fabricate scatter bar assist features that remain subresolution. In contrast, in accordance with the present invention, the width of the gray bar assist feature is not limited to such a sub-resolution width. Moreover, it is also possible to utilize gray bar assist features between features having a line:space duty ratio of 1:1.2. Indeed, if required, gray bar assist features could also be placed between features having a line:space duty ratio of 1:1.

FIGS. 6(a)–6(c) illustrate how the primary diffraction orders (i.e., 0, 1st and 2nd) are influenced by the gray bar assist features of the present invention. The zero order magnitude values (FIG. 6(a)) are plotted along with the first order magnitude (FIG. 6(b)) and the second order magnitude (FIG. 6(c)) values normalized to the resulting value of the zero order. The plots correspond to features having a 1:2.5 line:space duty ratio with gray bar assist features ranging from zero width to a width equal to the entire space opening in the mask. A fractional bar width of zero implies no bar, and a fractional width of 1.00 implies a full space width bar. The transmission of the gray bars is variable from 0% (binary) to 100% (no bar). As shown in FIGS. 6(a)–6(c), by utilizing the gray bar assist features it is possible to control the magnitude of the second diffraction order so as to prevent the printing of the assist features which would otherwise occur. In comparison, the second diffraction order corresponding to the scatter bar (0% transmission) exhibits a large increase relative to the gray bar assist features, which indicates that the scatter bar is more likely to print than the gray bar. The gray bar assist features also provide for a decrease in the zero diffraction order and a decrease in the first diffraction order, which advantageously functions to drive the isofocal inflection point and the image intensity of the 1:2.5 duty ratio features to that of the more dense features.

FIGS. 7(a)–7(c) illustrate "equivalent solutions" for known scatter bars and gray bar assist features of the present invention. The feature width and spacing and the imaging conditions utilized in conjunction with the images of FIGS. 7(a)–7(c) are the same as those described above in conjunction with the images of FIGS. 6(a)–6(c). The zero order magnitude values (FIG. 7(a)) are plotted along with the first order magnitude (FIG. 7(b)) and the second order magnitude (FIG. 7(c)) values normalized to the resulting value of the zero order.

Referring to FIG. 7(a), the zero order magnitude of a scatter bar having a fractional width of 0.17 is substantially equivalent to a gray bar having a fractional width of 0.33 and 25% transmission, and is also substantially equivalent to a gray bar having a fractional width of 0.50 and 50% transmission. Importantly, however, referring to FIG. 7(c), it is shown that the magnitude of the second diffraction order for the scatter bar increases significantly relative to the second diffraction order of the gray bar assist features, which significantly increases the likelihood of the printing of the scatter bar. As such, FIG. 7(c) makes clear that a gray bar assist feature having a large width is less likely to print than a scatter bar having a narrow width due to the relative reduction in the value of the second diffraction order by the gray bar assist feature as compared to that of the scatter bar.

Moreover, as the wavelength of the exposing source continues to decrease, the ability to create non-resolvable scatter bars will become more difficult. The gray bar assist features of the present invention eliminate this problem by allowing for widths significantly larger than that of the corresponding equivalent scatter bar.

Figures 8C, 8D:
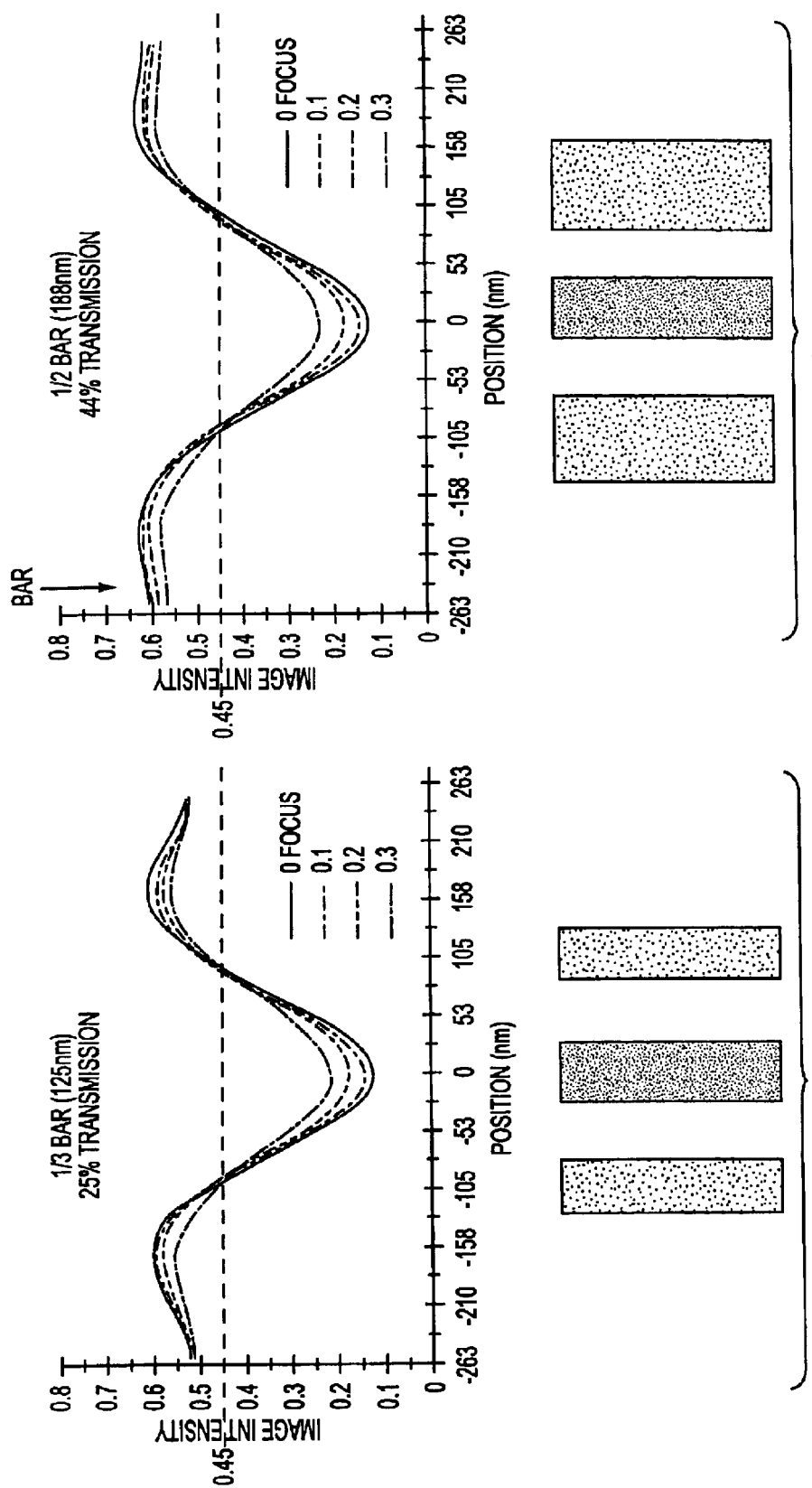

FIGS. 8(a)–8(d) illustrate simulated aerial images for a 150 nm wide feature having a line:space duty ratio of 1:2.5, which are imaged with a 248 nm wavelength, a 0.70 lens pupil NA, and a partial coherence value (sigma) of 0.85. Each image is plotted for 0 defocus to 300 nm of defocus. FIG. 8(a) illustrates the results without utilizing any gray bar assist features. As shown, the resulting image isofocal inflection value of the resulting image is 0.71. FIGS. 8(b)–8(d) illustrate three gray bar solutions for the 1:2.5 duty ratio features of FIG. 8(a) that result in equivalent zero order reduction. Specifically, FIG. 8(b) corresponds to a 0% transmission gray bar (i.e., a scatter bar) with a 0.17 fractional width, FIG. 8(c) corresponds to a 25% transmission gray bar with a 33% fractional width, and FIG. 8(d) corresponds to a 44% transmission gray bar with a 50% fractional width. As shown, the isofocal inflection point for each solution (FIGS. 8(b)–8(d)) is 0.45, which represents a reduction in the isofocal inflection point relative to the non-corrected feature shown in FIG. 8(a). It is further noted that the intensity of the bar region ($I_{BAR}$) for the 44% transmitting 0.5 width bar is 16% larger than that for the 0.17 fractional width bar. In addition, the $I_{BAR}$ for the 25% transmission gray bar with a 33% fractional width is also greater than that for the 0.17 fractional width bar. Thus, the likelihood that the gray bar assist features of FIG. 8(c) or FIG. 8(d) will print is significantly reduced in comparison to that of the equivalent scatter bar version of FIG. 8(b).

Figure 9:
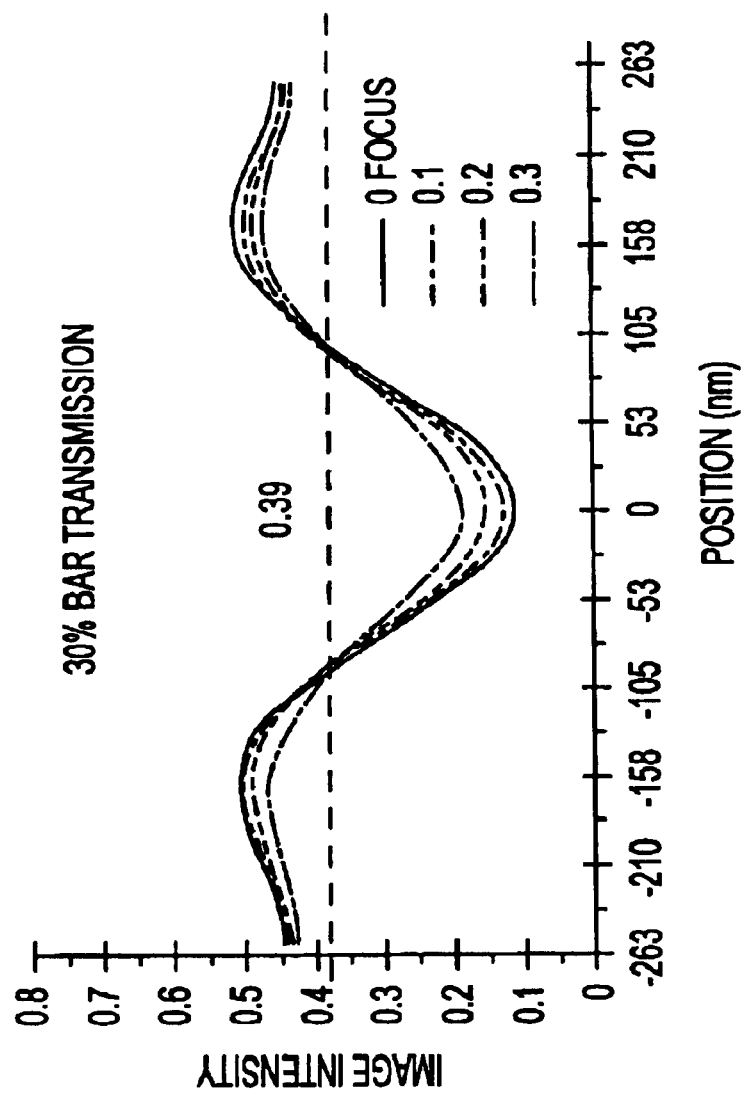
FIG. 9 illustrates how the gray bar assist features can be tuned to further decrease the isofocal inflection point in comparison to the reduction illustrated in FIG. 8(d).

FIG. 9 illustrates how the gray bar assist features can be tuned to further decrease the isofocal inflection point in comparison to the reduction illustrated in FIG. 8(d). Referring to FIG. 9, the gray bar assist feature utilized to generate the aerial image was a 30% transmission gray bar with a fractional width of 50%. All other imaging conditions, feature width and feature line:space ratio are the same as utilized in FIG. 8(d). As shown, the isofocal inflection point is reduced an additional 13% to a value of 0.39 and the printability of the bar remains low due to the dampened second diffraction order.

Figure 10:
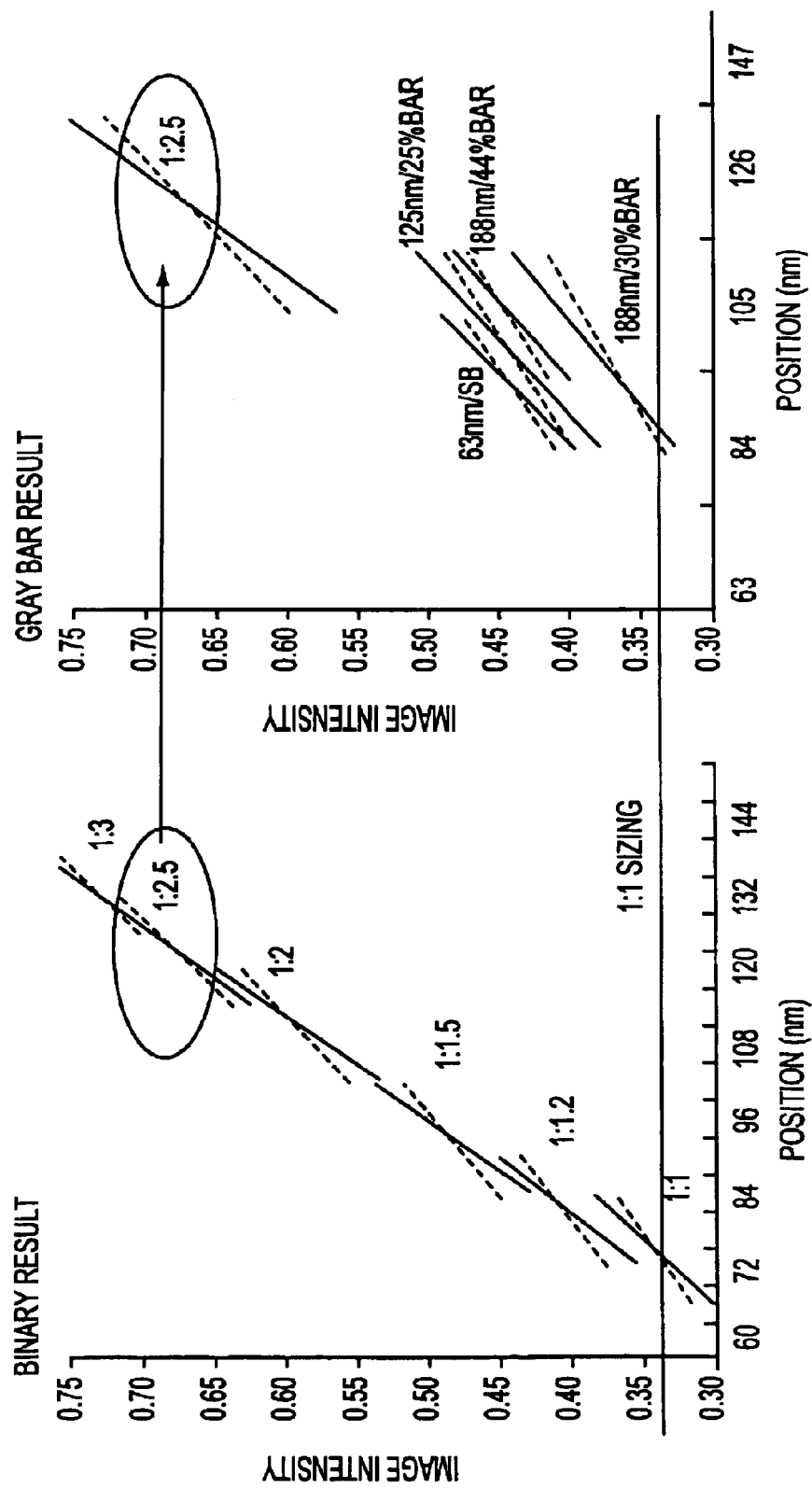
FIG. 10 illustrates the effect of various gray bar assist features on a 150 nm feature having a line:space duty ratio of 1:2.5.

FIG. 10 illustrates the effect of various gray bar assist features on a 150 nm feature having a line:space duty ratio of 1:2.5. As shown in each of the four examples, the use of the gray bar assist feature provides an improvement by reducing the isofocal inflection point and the resulting CD of the 1:2.5 feature to closer to that of the 1:1 feature. As explained above, this reduction in the isofocal inflection point and the resulting CD allows for an increase in across pitch process overlap. In other words, the gray bars of present invention allow for the matching of printing performance of more isolated features to that of more dense features, while simultaneously minimizing the chance that the assist feature will print. The gray bars of the present invention accomplish this by allowing for some transmission within the assist bars and by preserving spatial frequency by using a single bar between features, thereby providing for more adjustment of the isofocal inflection points.

Figure 11:
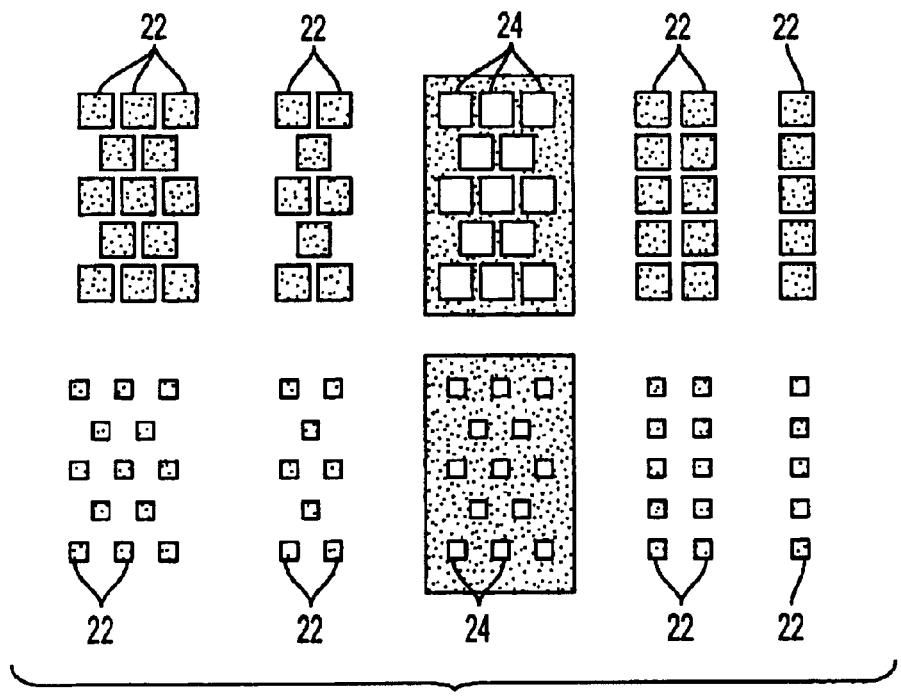
FIG. 11 illustrates a first exemplary structure for implementing the gray bar assist features of the present invention.
Figure 12:
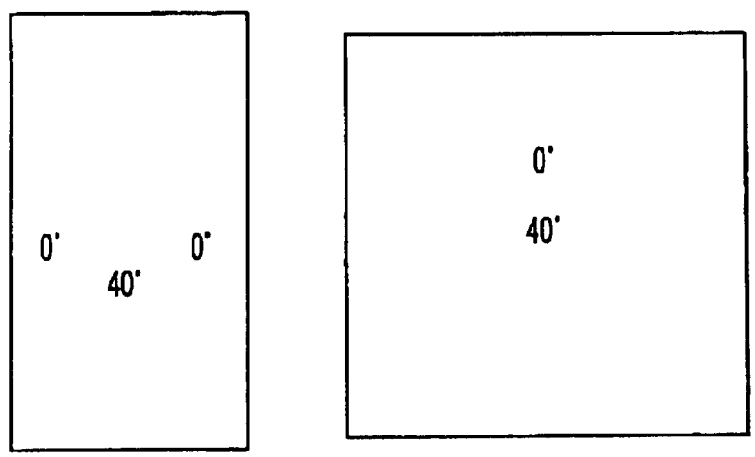
FIG. 12 illustrates a second exemplary structure for implementing the gray bar assist features of the present invention.

There are numerous possible methods for fabricating the gray bar assist features of the present invention. For example, one solution is the use of half-tone features as small sub-resolution masking elements placed relative to one another such that first diffraction orders of the elements are not collected with the imaging tool. In other words, the size of the sub-resolution elements are small enough so that only the DC component of the diffraction pattern contributes to image formation. These sub-resolution elements can consist of small islands 22 or holes 24, such as those shown in FIG. 11. The sizing and pitch of these features are adjusted to achieve the desired transmission values within the gray bar. For example, using a 248 nm wavelength and 0.70 NA with a partial coherence value of 0.85, 60 nm islands placed on 80, 100, 120 and 140 nm grids result in transmission values of 21%, 45%, 62% and 74%, respectively. Alternatively, a half-tone gray bar can be fabricated using sub-π or super-π phase-shifted elements on a sub-resolution grid as illustrated in FIG. 12. Phase islands of 40, 60, 80 and 100 degrees result in transmission values of 12%, 25%, 42% and 60%, respectively.

A multilayer mask structure can also be utilized to form the gray bar assist features. Referring to FIG. 13, in an exemplary embodiment, an amorphous Si or a Si-rich silicon layer 32 is formed on a quartz substrate 30, and a conventional anti-reflective (AR) chrome masking layer 34 is formed on the amorphous silicon (Si) layer so as to allow for dual tone masking. The amorphous Si layer is patterned as the gray bar masking level and the AR chrome layer is patterned as the main feature level. The thickness of the amorphous Si layer is adjusted so that transmission falls within the desired gray bar range, which, for example, corresponds to a thickness between 30 angstroms and 300 angstroms. The mask can be fabricated, for example, using conventional multiple-level electron beam and patterning processes. In one exemplary method, a mask substrate is pre-deposited with the amorphous Si and AR chrome layers. A positive acting electron-sensitive polymer is coated over the deposited substrate. An electron beam is used to expose areas where neither the main features or the gray bar features will exist. The polymer is removed in the exposed regions and the AR chrome and the amorphous Si are removed from the openings. A second patterning step is carried out which involves a second coating of electron sensitive polymer; electron beam exposure of gray bar regions only; and etching of the AR chrome from the amorphous Si gray bars. The resulting optical density (OD) of the gray bar region is defined as:

$$OD = -\log(T)$$

where T is transmission % and OD corresponds to transmission values between 0 and 100%.

It is noted that it is also possible to utilize the gray bar assist features of the present invention in combination with an attenuated phase-shift mask (APSM). The magnitude of the zero, first and second diffraction orders as influenced by ASPM and the gray bar assist features can be calculated as follows:

Mag. zero order = $[[1+\sqrt{T}](s/p) - \sqrt{T}] \times [1-(b/s)(1-\sqrt{I_b})](s/p)$ Mag. first order = $[1+\sqrt{T}](s/p)\text{sinc}(s/p) - |(1-\sqrt{I_b})(b/p)\text{sinc}(b/p)|$ Mag. second order = $[1+\sqrt{T}](s/p)\text{sinc}(2s/p) - |(1-\sqrt{I_b})(b/p)\text{sinc}(2b/p)|$ where T is the transmission value of the absorbing phase shifters.

Figure 14A:
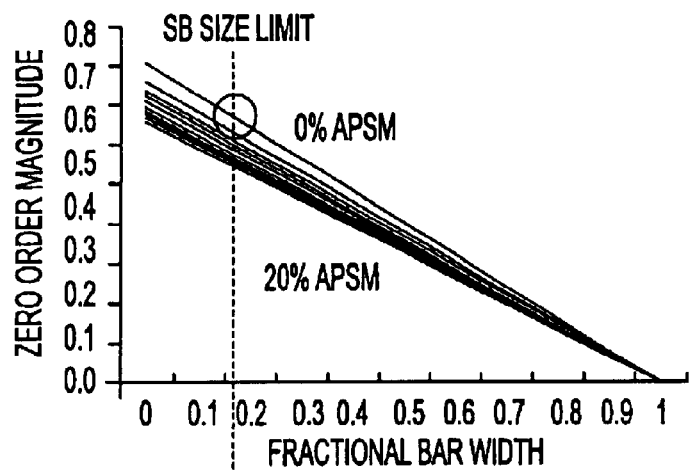
FIGS. 14(a)–(c) are plots of the primary diffraction orders resulting from the combination of an opaque assist bar (scatter bar) with APSM for features having a 1:2.5 line:space duty ratio.
Figure 14B:
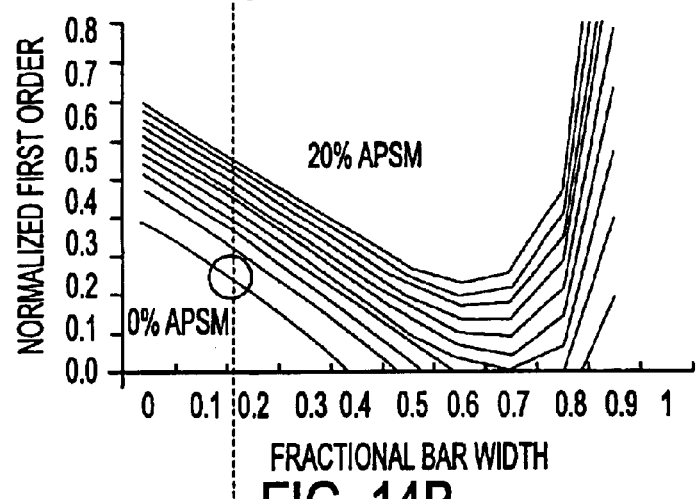
Figure 14C:
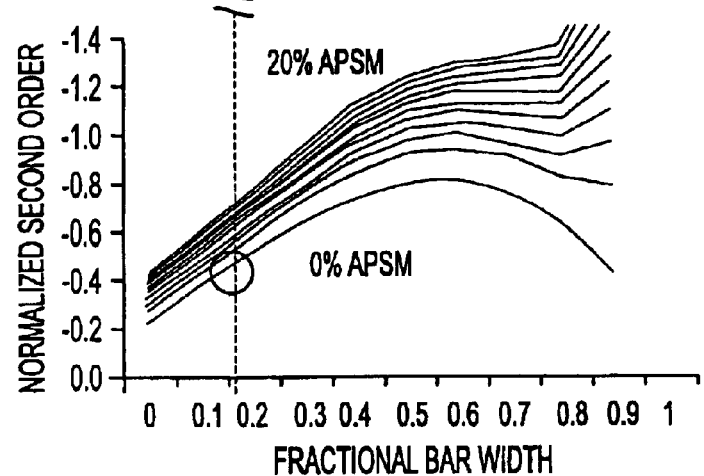

FIGS. 14(a)–(c) are plots of the primary diffraction orders resulting from the combination of an opaque assist bar (scatter bar) with APSM for features having a 1:2.5 line:space duty ratio. APSM values are varied from 0% (binary) to 20%. The scatter bar widths are varied from zero to the full space width. As set forth above, a practical limit of a single scatter bar may be 0.15 to 0.20 of the space width opening. The results indicate that by combining opaque assist bars with APSM, increased APSM transmission can be utilized. For example, a 10% APSM using a 0.17 width SB results in side lobes equivalent to those for a 6% APSM without assist bars.

Figure 15A:
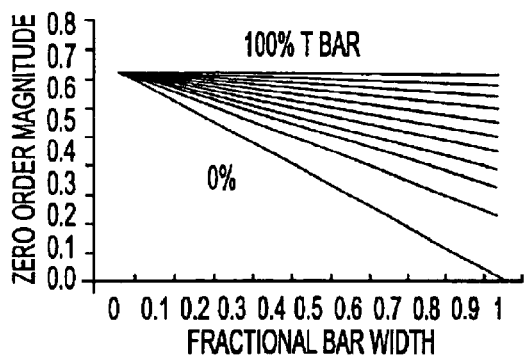
FIGS. 15(a)–(f) illustrate two APSM examples combined with gray bar assist features of the present invention.
Figure 15D:
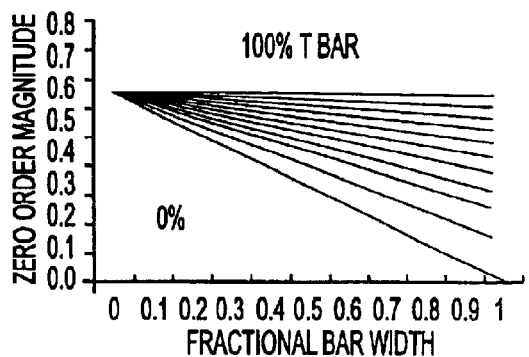
Figure 15B:
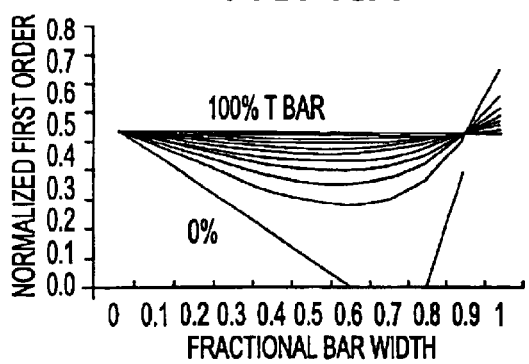
Figure 15E:
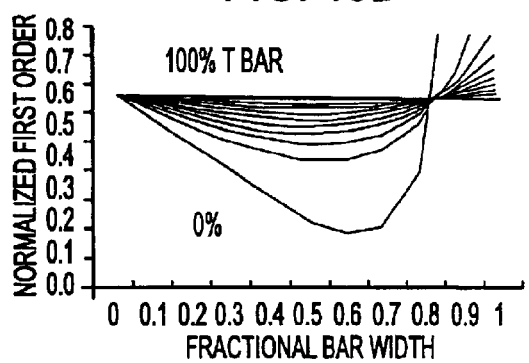
Figure 15C:
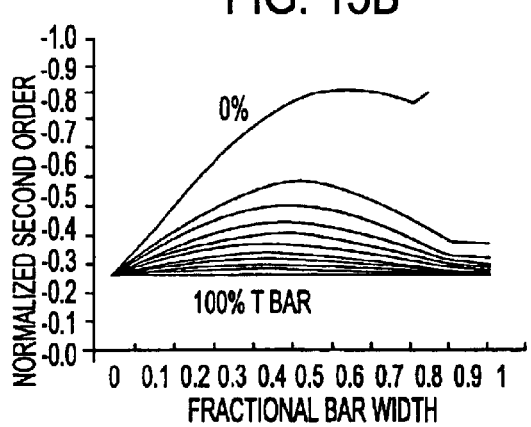
Figure 15F:
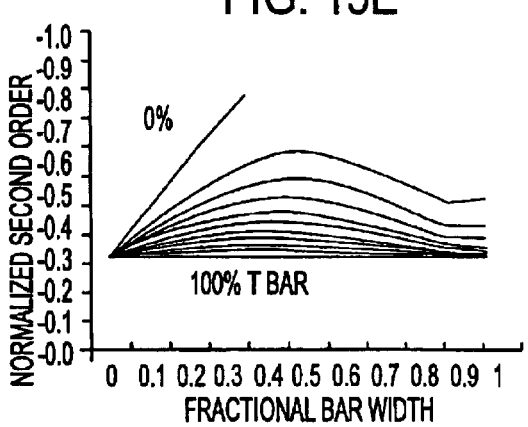

FIGS. 15(a)–(f) illustrate two APSM examples combined with gray bar assist features of the present invention. FIGS. 15(a)–(c) are of the zero, normalized first and normalized second diffraction order values, respectively, for a feature having a 1:2.5 line:space duty ratio and 6% APSM with various gray bar widths and gray bar transmissions. FIGS. 15(d)–(f) illustrate the same, with the exception being the use of 18% APSM. The results set forth in FIGS. 15(a)–(f) illustrate how APSM reduces the value of the zero order while increasing the value of the first order and impacting the value of the second order to a lesser degree. At a gray bar width of zero, the increase in the first order can be large enough for high transmission APSM that side-lobe artifacts result. However, the use of gray bar assist features reduces the zero order as well as the first order, thereby decreasing the likelihood of such side-lobe effects.

Figure 17:
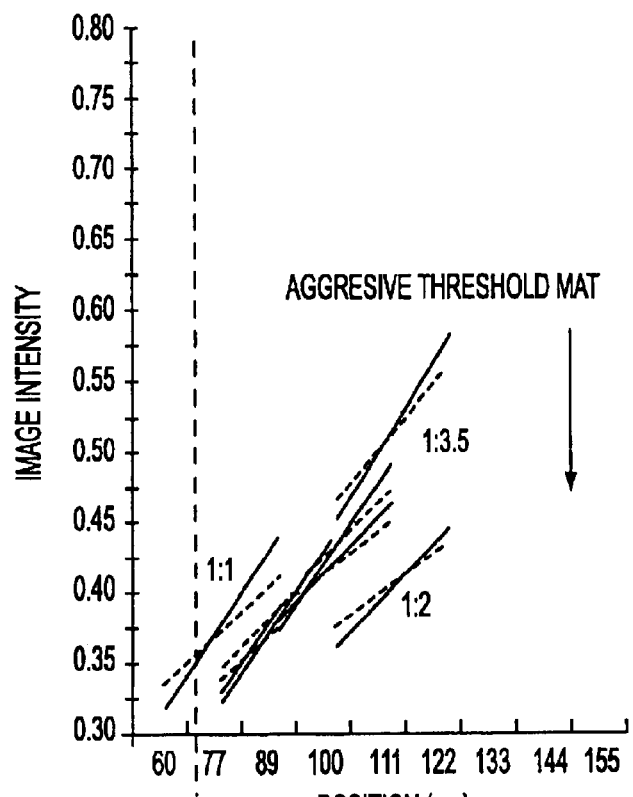
FIG. 17 illustrates the improved imaging results obtained utilizing the gray bar assist features of the present invention.
Figure 18:
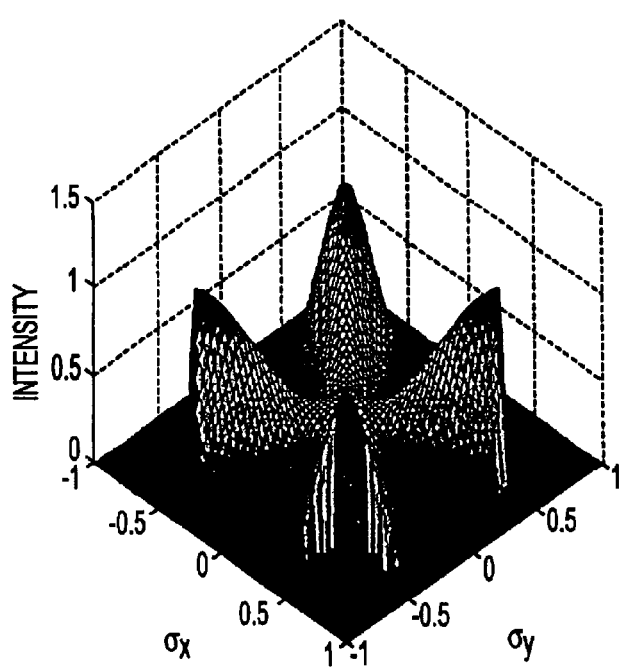
FIG. 18 illustrates a custom illumination utilized to further enhance the performance of the gray bar assist features of the present invention.

As detailed above, the gray bar assist features of the present invention allow for an increase in process overlap by reducing the isofocal inflection point and resulting CD of non-dense features closer to that of dense features. In the examples set forth herein, gray bar solutions were present for features having line:space duty ratio values between 1:1.2 and 1:3.5 using the primary diffraction order evaluation equations. This approach allows for these solutions to be generated prior to any lithographic simulation or imaging. FIG. 16 summarizes the results including the line bias required for each feature and the gray bar dimension for a 50% transmission value. It is noted that preferably, the bar width is always centered within the space opening and the widths vary from 50 nm for the 1:1.2 features up to 220 nm for the 1:3.5 features. FIG. 17 illustrates the improved imaging results obtained utilizing these gray bar solutions. It is noted that the results set forth in FIG. 17 also utilized a custom illumination as illustrated in FIG. 18. As shown, the isofocal slices for all line:space duty ratios were brought close to that for the 1:1 features, with respect to both intensity and position.

Figure 19:
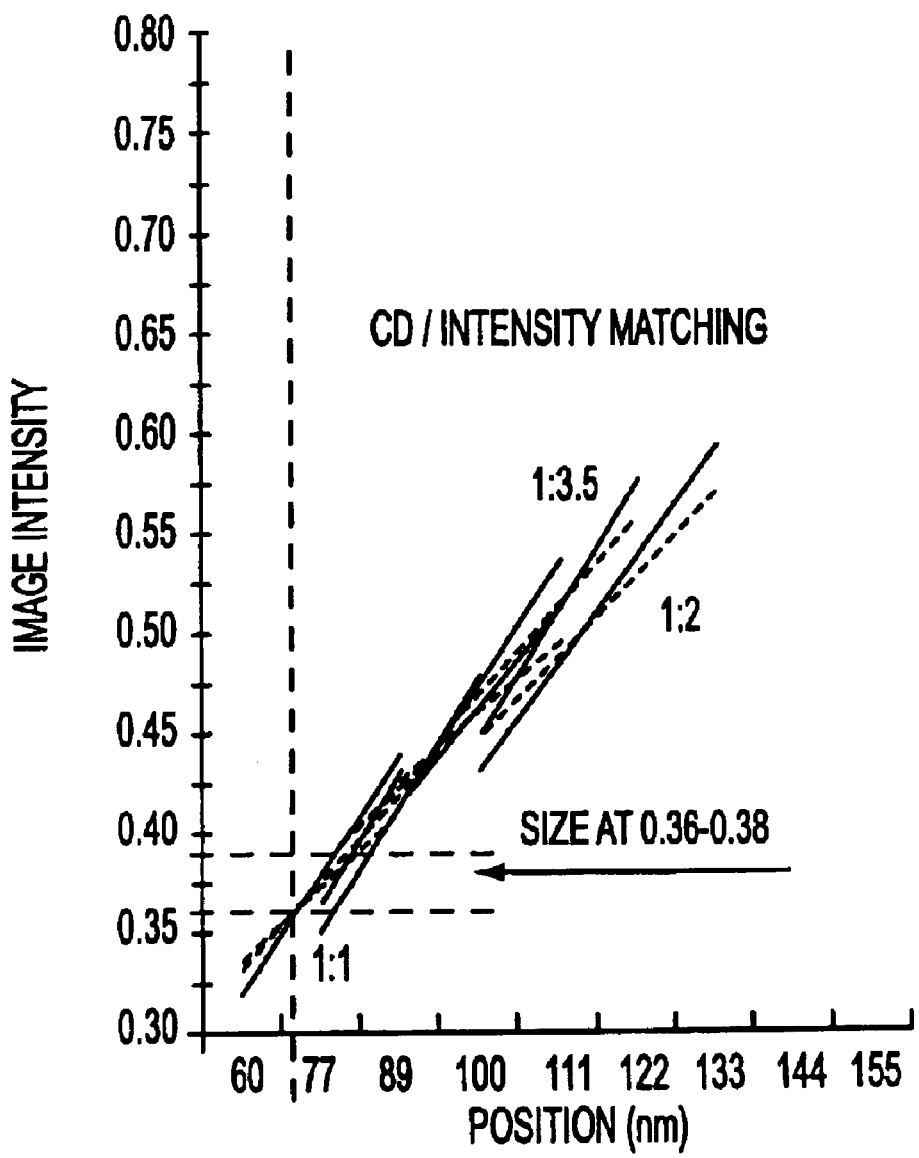
FIG. 19 illustrates the improved imaging results obtained utilizing the gray bar assist features of the present invention, when further corrected to account for a problem pitch.

It is noted that the 1:2 duty ratio case was a problem pitch as a result of the pitch of the features being a multiple of 1.5× of the 1:1 features optimized with the foregoing illumination condition. The illumination condition places the first diffraction order of the 1:2 duty ratio features in the center of the objective lens pupil, resulting in a maximum defocus aberration effect when combined with its corresponding zero order. A second gray bar solution was performed to compensate for this problematic pitch effect and resulting image is shown in FIG. 19.

As noted above, the present invention provides significant advantages over known OPC assist features. Most importantly, by manipulating the dimensions and transmission coefficient of the gray bar assist features, the present invention allows for features having various line: space duty ratios to be printed utilizing the same process window, while simultaneously minimizing the likelihood that the assist feature will print.

It is further noted that numerous variations of the present invention are also possible. For example, the gray bar assist features can be utilized with off-axis illumination techniques, such as quadrapole illumination. In addition, it is also possible to develop an analytical model for determining the optimum combination or optical-image enhancement. This technique is an analytical method of utilizing the mask electric field character and the resulting diffraction energy distribution produced from imaging situations using one or more optical-image enhancement (OE) techniques. By representing the effect that the OE techniques have on the primary fundamental diffraction orders, a common basis is introduced for their combination and mutual cooperation. Mask modifications can be related to their impact on these fundamental orders. Illumination can be related to the distribution and specific collection of these orders. Aberration effects (including defocus) can be combined to account for phase variations of the diffraction orders. By analyzing these effects in the frequency domain of the lens, design and optimization is possible. This design and optimization method can be incorporated into a computer program.

Figure 20:
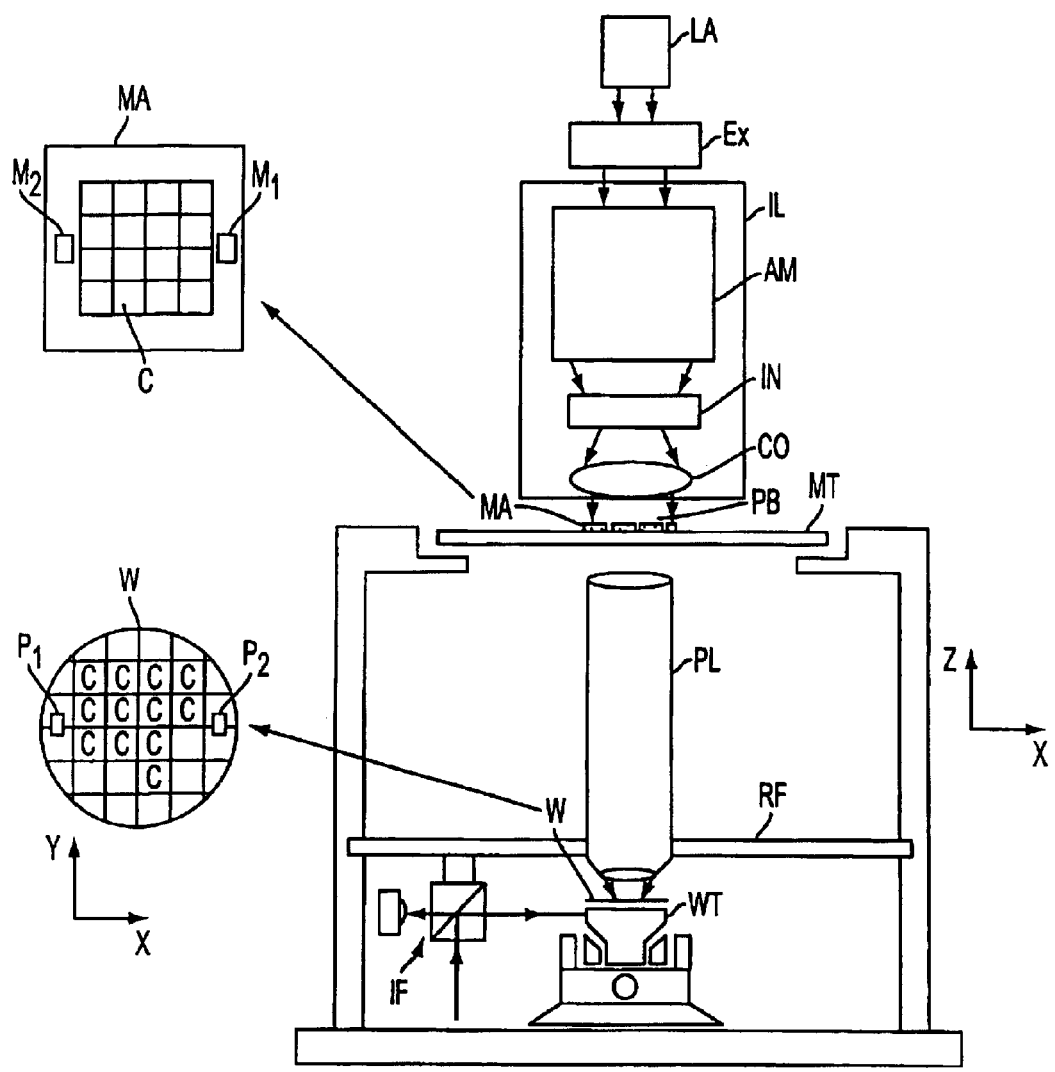
FIG. 20 schematically depicts a lithographic projection apparatus suitable for use with a mask designed with the aid of the current invention.

FIG. 20 schematically depicts a lithographic projection apparatus suitable for use with a mask designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 20 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 20. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

I claim:

1. A photolithography mask for optically transferring a pattern formed in said mask onto a substrate, said mask comprising:

a plurality of resolvable features to be printed on said substrate; and a non-resolvable optical proximity correction feature disposed between two of said plurality of resolvable features, said non-resolvable optical proximity correction feature having a transmission coefficient in the range of greater than 0% to less than 100%, said transmission coefficient of said non-resolvable optical proximity correction feature being selected so as to minimize a second order diffraction component corresponding to said non-resolvable optical proximity correction feature.

2. The photolithography mask of claim 1, further comprising a plurality of said non-resolvable optical proximity correction features, wherein one of said non-resolvable optical proximity correction features is placed between pairs of said resolvable features.

3. The photolithography mask of claim 1, wherein said mask is illuminated utilizing off-axis illumination.

4. A computer program product for controlling a computer comprising a recording medium readable by the computer, means recorded on the recording medium for directing the computer to generate at least one file corresponding to a photolithography mask for optically transferring a pattern formed in said mask onto a substrate, said mask comprising:

a plurality of resolvable features to be printed on said substrate; and a non-resolvable optical proximity correction feature disposed between two of said plurality of resolvable features, said non-resolvable optical proximity correction feature having a transmission coefficient in the range of greater than 0% to less than 100%, said transmission coefficient of said non-resolvable optical proximity correction feature being selected so as to minimize a second order diffraction component corresponding to said non-resolvable optical proximity correction feature.

5. The computer program product of claim 4, wherein said mask further comprises a plurality of said non-resolvable optical proximity correction features, wherein one of said non-resolvable optical proximity correction features is placed between pairs of said resolvable features.

6. The computer program product of claim 4, wherein said mask is illuminated utilizing off-axis illumination.

7. A method of transferring a lithographic pattern from a photography mask onto a substrate by use of a lithographic exposure apparatus, said method comprising the steps of:
   forming a plurality of resolvable features to be printed on said substrate; and
   forming at least one non-resolvable optical proximity correction feature, said at least one non-resolvable optical proximity correction feature having a transmission coefficient in the range of greater than 0% to less than 100%,
   said transmission coefficient of said non-resolvable optical proximity correction feature being selected so as to minimize a second order diffraction component corresponding to said non-resolvable optical proximity correction feature.

8. The method of claim 7, further comprising the step of forming one of said non-resolvable optical proximity correction features between pairs of said resolvable features.

9. The method of claim 7, wherein said mask is illuminated utilizing off-axis illumination.

10. The method of claim 7, further comprising the step of adjusting the width, position and transmission coefficient of said non-resolvable optical proximity correction feature so as to maximize the process window for printing said plurality of resolvable features.

11. A device manufacturing method comprising the steps of:
   (a) providing a substrate that is at least partially covered by a layer of radiation-sensitive material;
   (b) providing a projection beam of radiation using a radiation system;
   (c) using a pattern on a mask to endow the projection beam with a pattern in its cross-section;
   (d) projecting the patterned beam of radiation onto a target portion of the layer of radiation-sensitive material,
   wherein, in step (c), use is made of a mask comprising:
   a plurality of resolvable features to be printed on said substrate; and
   a non-resolvable optical proximity correction feature disposed between two of said plurality of resolvable features, said non-resolvable optical proximity correction feature having a transmission coefficient in the range of greater than 0% to less than 100%,
   said transmission coefficient of said non-resolvable optical proximity correction feature being selected so as to minimize a second order diffraction component corresponding to said non-resolvable optical proximity correction feature.

12. A method of transferring a lithographic pattern from a photography mask onto a substrate by use of a lithographic exposure apparatus, said method comprising the steps of:
   forming a plurality of resolvable features in said mask to be printed on said substrate;
   forming at least one non-resolvable optical proximity correction feature in said mask, said at least one non-resolvable optical proximity correction feature having a transmission coefficient in the range of greater than 0% to less than 100%, and
   adjusting the width, position and transmission coefficient of said non-resolvable optical proximity correction feature so as to maximize the process window for printing said plurality of resolveble features.

13. The method of claim 12, further comprising the step of forming one of said non-resolvable optical proximity correction features between pairs of said resolvable features,
   wherein the width, position and transmission coefficient of each of said non-resolvable optical proximity correction features is adjusted so as to maximize the process window for printing said plurality of resolvable features.

14. The method of claim 13, wherein said non-resolvable optical proximity correction features function to minimize the increase in a second order diffraction component of said mask.

15. The method of claim 13, wherein said non-resolvable optical proximity correction features function to reduce an isofocal inflection point associated with a given set of said resolvable features.

16. A photolithography mask for optically transferring a pattern formed in said mask onto a substrate, said mask comprising:
   a plurality of resolvable features to be printed on said substrate; and
   a plurality of non-resolvable optical proximity correction features, said non-resolvable optical proximity correction feature having a transmission coefficient in the range of greater than 0% to less than 100%,
   wherein said plurality of resolvable features include densely spaced features and non-densely spaced features, said non-resolvable optical proximity features being disposed between said non-densely spaced features, said transmission coefficient of said non-resolvable optical proximity correction features disposed between said non-densely spaced features being adjusted such that the difference between an isofocal inflection point associated with said non-densely spaced resolvable features and an isofocal inflection point associated with said densely spaced resolvable features is minimized.

17. A computer program product for controlling a computer comprising a recording medium readable by the computer, means recorded on the recording medium for directing the computer to generate at least one file corresponding to a photolithography mask for optically transferring a pattern formed in said mask onto a substrate, said mask comprising:
   a plurality of resolvable features to be printed on said substrate; and
   a plurality of non-resolvable optical proximity correction features, said non-resolvable optical proximity correction feature having a transmission coefficient in the range of greater than 0% to less than 100%,
   wherein said plurality of resolvable features include densely spaced features and non-densely spaced features, said non-resolvable optical proximity features being disposed between said non-densely spaced features, said transmission coefficient of said non-resolvable optical proximity correction features disposed between said non-densely spaced features being adjusted such that the difference between an isofocal inflection point associated with said non-densely spaced resolvable features and an isofocal inflection point associated with said densely spaced resolvable features is minimized.

18. A method of transferring a lithographic pattern from a photography mask onto a substrate by use of a lithographic exposure apparatus, said method comprising the steps of:

forming a plurality of resolvable features to be printed on said substrate; and forming at least one non-resolvable optical proximity correction feature, said at least one non-resolvable optical proximity correction feature having a transmission coefficient in the range of greater than 0% to less than 100%, wherein said plurality of resolvable features include densely spaced features and non-densely spaced features, said non-resolvable optical proximity features being disposed between said non-densely spaced features, said transmission coefficient of said non-resolvable optical proximity correction features disposed between said non-densely spaced features being adjusted such that the difference between an isofocal inflection point associated with said non-densely spaced resolvable features and an isofocal inflection point associated with said densely spaced resolvable features is minimized.

* * * * *